United States Patent [19]

Liu

[11] Patent Number: 4,692,397

[45] Date of Patent: Sep. 8, 1987

[54] PROCESS FOR DEVELOPING AN AQUEOUS ALKALINE DEVELOPMENT DIAZO PHOTOGRAPHIC ELEMENT

[75] Inventor: Shuchen Liu, Clinton, N.J.

[73] Assignee: American Hoechst Corporation, Somerville, N.J.

[21] Appl. No.: 802,655

[22] Filed: Nov. 27, 1985

[51] Int. Cl.$^4$ ............................ G03F 7/08; G03F 7/26
[52] U.S. Cl. .................................... 430/325; 430/143; 430/145; 430/149; 430/155; 430/175; 430/302; 430/309; 430/331
[58] Field of Search ............... 430/175, 143, 149, 331, 430/309, 302, 155, 325, 145

[56] References Cited

U.S. PATENT DOCUMENTS

| | | | |
|---|---|---|---|
| 3,396,019 | 8/1968 | Uhlig | 430/175 |
| 3,669,660 | 6/1972 | Golda et al. | 430/331 |
| 3,679,419 | 7/1972 | Gillich | 430/175 |
| 4,186,006 | 1/1980 | Kobayashi et al. | 430/309 |
| 4,391,897 | 7/1983 | Gracia et al. | 430/302 |
| 4,492,748 | 1/1985 | Lutz et al. | |

FOREIGN PATENT DOCUMENTS

| | | | |
|---|---|---|---|
| 1172492 | 8/1984 | Canada | 430/175 |
| 0051081 | 11/1980 | European Pat. Off. | |
| 0104537 | 9/1983 | European Pat. Off. | |
| 0126875 | 3/1984 | European Pat. Off. | |
| 1313777 | 4/1973 | United Kingdom | 430/143 |

*Primary Examiner*—Charles L. Bowers, Jr.
*Attorney, Agent, or Firm*—Richard S. Roberts

[57] ABSTRACT

A method of producing a light sensitive element wherein a substrate is coated with a photosensitive layer having a particular class of diazonium salts, a colorant and a polyvinyl acetal resin. Upon imagewise exposure it is developed with an aqueous composition of salts and surfactants in the absence of organic solvents.

16 Claims, No Drawings

PROCESS FOR DEVELOPING AN AQUEOUS ALKALINE DEVELOPMENT DIAZO PHOTOGRAPHIC ELEMENT

BACKGROUND OF THE INVENTION

The present invention relates to a method for producing a photographic element or more particularly to lithographic printing plates containing a particular class of light sensitive, aromatic diazonium salt condensation products, a colorant and a small amount of water insoluble polyvinyl acetal resin. Upon imagewise exposure of the element, it is developable with an aqueous developer which does not contain organic solvents.

It is known to produce polycondensation products by reacting aromatic diazonium salts, particularly diphenylamine-4-diazonium salts, with active carbonyl compounds, preferably formaldehyde. Condensation products of this type are described in U.S. Pat. No. 2,063,631. Their uses are described, e.g., in U.S. Pat. No. 3,235,383.

Such condensation products are used on a large scale in the production of printing forms. For this purpose, products for the condensation of which formaldehyde is used as the carbonyl compound have gained practically exclusive acceptance.

Although formaldehyde condensation products are still produced and used on a large scale, they have the disadvantage that their composition and properties can only be varied to a limited degree. When these products are used for the production of planographic printing forms, the oleophilic character of their light-hardening products is normally not sufficient in itself. The developed image stencil is therefore frequently reinforced by coating the stencil with a solution of an olephilic resin. Such resins may also be admixed into the image layer from the start, but it is then generally necessary to add organic solvents to the developer.

In more recent times, the problem of variability has been solved by producing mixed condensation products, in the production of which, in addition to a carbonyl compound and a diazonium salt, a second component is employed which is condensable with formaldehyde.

These products and their uses are described in U.S. Pat. No. 3,867,147. They can advantageously also be produced by condensing the diazonium salt with a second component which carries reactive methylol groups or the esters or ethers thereof, the reactive groups being introduced, in the simplest case, by reacting the second component with formaldehyde. These condensation products yield high-quality radiation-sensitive materials, in particular printing plates, and are used on a large industrial scale.

It is, however, a disadvantage of these condensation products that in the exposure of binder-free layers comprising preferred representatives of these condensates, not all of the diazonium groups are decomposed. As a result, oleophilicity is reduced. Under the action of light, the undecomposed diazonium groups may, moreover, react with the hydrophilic polymer used for preservation, to form ink-repellent reaction products.

It is true that by increasing the amount of oleophilic second component in the condensation product, condensates are obtained which are to a higher degree oleophilic, but developing these condensates is more difficult and they are less suitable for storage then the normally preferred representatives.

In column 8, lines 32 to 42 of the aforementioned U.S. patent, another possibility of variation in the preparation of the condensation products is mentioned comprising the condensing of monofunctional and bi- or polyfunctional second components with the diazonium salt, thus limiting the molecular weight of the polycondensation products. A monofunctional second component is only used in Example 23 and is there combined with formaldehyde.

In European Published Patent Application No. 61,150, a highly light-sensitive and oleophilic condensation product is obtained by condensing the second component with itself and then reacting it with a monomeric diazonium compound. In the light-sensitive layer, this condensation product is, however, also less suitable for storage and is more difficult to develop.

SUMMARY OF THE INVENTION

It is therefore an object of the present invention to provide a method for producing a photographic element which comprises coating a substrate with a light sensitive composition, which composition comprises (i) from about 1% by weight to about 21% by weight of a polyvinyl acetal resin; and (ii) from about 1.1% by weight to about 22% by weight of a colorant; and (iii) from about 63% by weight to about 92% by weight of a light-sensitive, water insoluble diazonium group-containing polycondensation product, which product is obtained first by condensation of (a) a diazonium salt corresponding to formula I

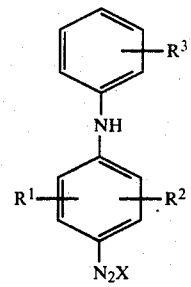

(I)

wherein $R^1$, $R^2$ and $R^3$ each denote separately a hydrogen atom, a halogen atom, an alkyl group having from 1 to 3 carbon atoms, or an alkoxy group having from 1 to 6 carbon atoms, and X denotes the anion of the diazonium salt;

(b) with a compound corresponding to formula II $$R^4-O-CH_2-R^5 \qquad (II)$$

wherein $R^4$ denotes a hydrogen atom, an alkyl group or an aliphatic acyl radical and $R^5$ denotes a mononuclear or polynuclear aromatic radical, which is unsubstituted or is substituted by a halogen atom, an alkyl group, a halogenated alkyl group, an alkoxy group having from 1 to 3 carbon atoms, a carboxy group, an aryl group, an arylmercapto group, or an aryloxy group, in a strongly acidic medium, and thereafter condensing with (c) a compound corresponding to formula III $$R^6-O-CH_2-R^8-CH_2-O-R^7 \qquad (III)$$

wherein $R^6$ and $R^7$ each denote separately a hydrogen atom, an alkyl group, or an aliphatic acyl radical, and $R^8$ denotes an aromatic hydrocarbon radical selected from the group consisting of a phenol, a phenolether, an aromatic thioether, an aromatic heterocyclic compound, and an organic acid amide, with the radicals resulting from compound II being directly linked to the units of the diazonium salt I; and thereafter imagewise exposing said coated substrate to actinic radiation and removing all or substanitally all of the non-image areas with a non-organic solvent containing developer composition which comprises:

A. from about 80% by weight to about 95% by weight water; and

B. from about 7.7% by weight to about 17% by weight of one or more salts selected from the group consisting of sodium, potassium, and ammonium hydroxides, silicates, phosphates, bicarbonates, oxalates, carbonates, sulfates, chlorides, acetates, benzoates, borates, citrates, salicylates, and pyrophosphates; and C. from about 0.3% by weight to about 3.0% by weight of an anionic surfactant.

The foregoing diazonium compounds are more fully described in U.S. Pat. application Ser. No. 593,091 filed Mar. 26, 1984 and which is incorporated herein by reference.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DESCRIPTION OF PREFERRED EMBODIMENTS

Examples of basic structures, from which the condensable compounds II and III, which are used in the present invention, are derived include benzene, biphenyl, diphenylether, diphenylsulfide, diphenylmethane, naphthalene, anthracene, thiophene, urea, oxalic acid amide, and succinic acid amide. The aromatic basic structures may carry further substituents, for example, alkyl, alkoxy, or hydroxy groups.

The above enumeration includes the most important groups of substances which may comprise the radicals $R^5$ and $R^8$. Other possibilities are mentioned in U.S. Pat. 3,867,147 and in Houben-Weyl, *Methoden der organischen Chemie* ("Methods of Organic Chemistry"), 4th edition, vol. 14/2, pages 193–402, "Polyaddition or condensation products of carbonyl and thiocarbonyl compounds," the contents of which are hereby incorporated by reference.

In the preparation of the condensation products according to the present invention, the two condensation reactions may be run successively in the same condensation medium, under relatively mild conditions, which are also conventionally used in the known preparation of mixed condensation products. In the process, adherence to the indicated sequence of condensation steps is essential. It is, however, not necessary to isolate the product obtained in the first condensation step, i.e., the two reactions may be carried out in a "one-pot process".

Consequently, it is necessary to effect, in a first step, the reaction of the diazonium salt I with the monofunctional compound II and only thereafter the reaction with the bifunctional compound III. Only these reaction conditions ensure that crude condensates result which dissolve in water to form clear solutions. As compound II, the following compounds or their etherification products with short-chain alcohols or their esterification products with short-chain aliphatic carboxylic acids may be used: Benzyl alcohol, 4-methylbenzyl alcohol, 4-isopropylbenzyl alcohol, 4-methoxybenzyl alcohol, 4-carboxy-benzyl alcohol, 4-phenylbenzyl alcohol, 4-phenoxy-benzyl alcohol, 4-p-tolyloxy-benzyl alcohol, 4-o-tolyloxy-benzyl alcohol, 4-chlorophenoxy-benzyl alcohol, benzohydrol, 4-phenylmercapto-benzyl alcohol, 4-fluoro-benzyl alcohol, 3-fluoro-benzyl alcohol, 2-fluoro-benzyl alcohol, 4-chloro-benzyl alcohol, 3-chloro-benzyl alcohol, 2-chloro-benzyl alcohol, and 2-fluoro-6-chloro-benzyl alcohol; 2-hydroxymethyl-naphthalene, 4-hydroxymethyl-thiophene, 1-hydroxymethyl-diphenyloxide, N-hydroxymethyl-benzoic acid amide, N-hydroxymethylurea, and 2-hydroxy-hydroxymethyl-benzene.

In the preferred compounds II, $R^5$ is a phenyl radical which is optionally substituted by halogen atoms, alkyl groups, halogenoalkyl groups, alkoxy groups having from 1 to 3 carbon atoms, phenyl, tolyl, phenylmercapto, phenoxy or tolyloxy groups.

Of these, those compounds are preferred, which (if they are substituted) have the substituent in the p-position.

The hydroxymethyl, methoxymethyl, and acetoxymethyl groups have a comparable reactivity in the acid condensation medium.

Useful diphenylamine-4-diazonium salts include compounds which may or may not have been substituted in ways known in the art. The diphenylamine-4-diazonium salts which have not been substituted or which have been substituted by an alkyl or, especially, an alkoxy group having from 1 to 3 carbon atoms, are preferred. Compounds in which the alkyl or alkoxy group is in the 3-position are especially advantageous. Examples of suitable diazonium compounds include those derived from the following amines: 4-amino-3-methoxy-diphenylamine, 4-amino-diphenylamine, 4'-amino-2-methoxy-diphenylamine, 4'-amino-4-methoxydiphenylamine, 4-amino-3-methyl-diphenylamine, 4-amino-3-ethyl-diphenylamine, 4'-amino-4-methyl-diphenylamine, 4-amino-3-hexyloxy-diphenylamine, 4-amino-3-ethoxy-diphenylamine, 4'-amino-2-methoxy-5-methyl-diphenylamine, 4'-amino-3,3'-dimethyl-diphenylamine, 3'chloro-4-aminodiphenylamine, 4'-amino-4-n-butoxy-diphenylamine, 4'-amino-3',4-dimethoxy-diphenylamine, and 4'-bromo-4-amino-diphenylamine.

4-amino-diphenylamine and 3-methyl-4-amino-diphenylamine are preferred. 3-methoxy-4-amino-diphenylamine, is particularly preferred. Hydrogen sulfate is preferably used as the anion of the diazonium salt. The reaction takes place in a strongly acid medium.

Suitable condensation agents include phosphoric acid, methanesulfonic acid and sulfuric acid, which agents are used in concentrations of at least 40, preferably 70 to 100, percent by weight. The rest, in general, is water, but it may also be partly or completely composed of organic solvents, e.g., methanol, acetic acid, N-methyl pyrrolidone, and the like. Good results are achieved, for example, by using 85 to 93 percent strength phosphoric acid, 80 percent strength sulfuric acid or 90 percent strength methanesulfonic acid or mixtures of these acids.

Eighty to 100 percent strength, in particular 85 to 93 percent strength phosphoric acid is a rather mild condensation agent in which the condensation reaction can be conducted very gently. It is, therefore, the preferred condensation agent for all combinations of compounds which react fast enough under these rather gentle conditions.

Eighty to 100 percent strength, in particular 90 percent strength methanesulfonic acid, is a stronger agent.

The process is perferably carried out in such a way that, on the one hand, a condensation mixture is obtained which can easily be stirred and mixed. When the type and quantity of the acid to be used are determined, its ability to undergo condensation reactions and the solubility of the components in the acid should be considered.

In general, condensation is carried out at temperatures from about 0° to about 70° C., preferably from 10° to 50° C.

The novel polycondensation products are generally separated in the form of a salt and, after the addition of the other desired layer components, used for preparing the coating solution in this form.

The polycondensation products can, for example, be separated and used as salts of the following acids:

Halogen hydracids, such as hydrofluoric acid, hydrochloric acid, hydrobromic acid; sulfuric acid, nitric acid, phosphoric acids (pentavalent phosphorus), in particular orthophosphoric acid; inorganic iso- and hetero-polyacids, e.g., phosphotungstic acid, phosphomolybdic acid, aliphatic or aromatic phosphonic acids or the half-esters thereof, arsonic acid, phosphinic acids, trifluoroacetic acid, amidosulfonic acid, selenic acid, hydrofluoboric acid, hexafluoro-phosphoric acid, perchloric acid; aliphatic and aromatic sulfonic acid, e.g., methanesulfonic acid, benzene-sulfonic acid, toluenesulfonic acid, mesitylenesulfonic acid, p-chlorobenzenesulfonic acid, 2,5-chlorobenzene-sulfonic acid, sulfosalicylic acid, naphthalene-1-sulfonic acid, naphthalene-2-sulfonic acid, 2,6-di-tert-butyl-naphthalenedisulfonic acid, 1,8-dinitro-naphthalene-3,6-disulfonic acid, 4,4'-diazido-stilbene-3,3-disulfonic acid, 1,2-naphthoquinone-2-diazide-4-sulfonic acid, 1,2-naphthoquinone-1-diazide-4-sulfonic acid.

Other organic sulfonic acids which can be used for separating the condensates are listed in columns 2 through 5 of U.S. Pat. No. 3,219,447, the contents of which are incorporated by reference.

Mesitylenesulfonic acid, naphthalene-2-sulfonic acid, and methanesulfonic acid are particularly preferred.

For the preparation of the diazo-poly-condensates, from 0.1 to 1.5 moles of compound II and from 0.5 to 1.5 moles of compound III are ususally employed, per mole of diazonium salt. The preferred amounts are from 0.5 to 1.2 moles of II and from 0.8 to 1.3 moles of III, per mole of diazonium salt.

In general, about 0.4 to 3, preferably 0.8 to 2 moles, of second components (II and III) are used, per mole of diazonium salt I.

The molar ratio II:III should be in the range from about 0.2 to 2:1, preferably from 0.6 to 1.2:1.

In printing layers, diazo-polycondensates in which compound II is present at a lower concentration have the same sensitivity to light, but exhibit an inferior ink receptivity upon the proof printing.

In addition, condensates which contain up to 1.3 moles of compound II and more than 1.5 moles of compound III, per 1 mole of diazonium salt, have a reduced storability in the light-sensitive layer.

One of the many advantages of the condensates produced in accordance with the process of the invention is that they can easily be separated in the form of salts which do not contain complex-forming metal salts. For example, many condensates give sulfates, chlorides, and bromides which are sparingly soluble in water and can easily be precipitated from aqueous solutions of the condensation mixtures by addition of the corresponding acids or water-soluble salts thereof. A more detailed description of the separation process will be given in the following Examples.

The polycondensation products of this invention are distinguished from the known diazonium-salt polycondensation products by a number of advantages. Compared with the former condensation products of formaldehyde and diazonium salt, they are easier to separate from the condensation medium and thus to isolate in a pure form. Light-sensitive recording materials, particularly printing plates, produced with the novel polycondensation products are less sensitive to fingerprints and generally exhibit a higher sensitivity to light.

These properties are similar to those of the mixed condensation products described in U.S. Pat. No. 3,867,147. Compared with these high-quality products, the products of the invention have the advantage that they have a more strongly pronounced binder character. This results in a higher oleophilicity, which is reflected in an improved ink receptivity.

In an attempt to attain this property of the condensate by increasing the amounts of the second components comprising at least two reactive groups, which are described in U.S. Pat. No. 3,867,147, relative to the amount of the diazonium salt groups used, products are obtained which yield layers of reduced storability.

Crude condensates which contain a considerable amount of water-insoluble condensate are obtained, if the two condensable compounds II and III are simultaneously added to the diazonium compound which is already present in the condensation medium.

Similarly, the crude condensates contain a high proportion of water-insoluble constituents, if diazonium compound I is first reacted with compound III and condensation with compound II is effected in a second step.

For the production of photographic elements, the diazonium-salt polycondensation products are dissolved in an appropriate solvent or together with the other layer components, and the resulting solution is coated onto the selected support.

In the practice of the present invention the polyvinyl acetal component is preferably present in the photosensitive composition in an amount ranging from about 1% to about 21% based on the weight of the non-solvent parts. A more preferred range is from about 2% to about 15%; and most preferably from about 4% to about 10%. The most preferred polyvinyl acetal resin is a polyvinyl formal available commercially from Monsanto.

The diazo component is preferably present in the photosensitive composition in an amount ranging from about 63% to about 92% based on the weight of the non-solvent parts. A more preferred range is from about 68% to about 87%; and most preferably from about 72% to about 82%.

The colorant component is preferably present in the photosensitive composition in an amount ranging from about 1.1% to about 22% based on the weight of the non-solvent parts. A more preferred range is from about 2.2% to about 16.5%; and most preferably from about 4.4% to about 11%. The most preferred colorant is a pigment.

The supports used for producing offset-printing plates are preferably made of metallic materials, particularly aluminum. Prior to the coating step, aluminum is generally roughened by mechanical or electrochemical means, optionally subjected to an anodic oxidation process and optionally treated with a solution of silicates, certain complex salts, phosphoric acids, or other known agents.

The light-sensitive layer is dried at room temperature or at elevated temperatures.

Various other substances may additionally be contained in minor amounts in the copying layers as further components. Examples of such additional layer ingredients include: Acids, such as phosphoric acid (in particular orthophosphoric acid), phosphonic acids, and phosphinic acids; the strong acids mentioned in U.S. Pat. No. 3,235,382, such as sulfuric acid or organic sulfonic acids, e.g., toluenesulfonic acid; organic polyacids, e.g., polyvinylphosphonic acid. Further additives include exposure indicators, plasticizers and surfactants.

All additives should be chosen such that they are compatible with the diazo-condensates and, moreover, that their absorption in the range of wavelengths which is essential for the photodecomposition of the diazonium compounds is as low as possible.

In general, the additives are employed in the following quantities: Acids of pentavalent phosphorus are generally used in quantities between 0.01 and 4 moles per mole of diazo group. The organic polyacids are, as far as they are readily water-soluble, generally only used in quantities between 0.01 and 3 moles of diazo groups.

The quantities of plasticizers, surfactants, sensitizers, indicators, and fatty acids added to the copying layers are in general not higher than 20 percent by weight, preferably not more than 10 percent by weight, based on the weight of the other layer constituents.

Depending on the layer constituents, the solvents used for preparing the coating solution may be, for example, water; alcohols, such as methanol or ethanol; glycol ethers, such as ethyleneglycol monoethyl ether; dimethyl formamide and diethylformamide.

Organic solvents which are in pure form or which contain a little water are preferably employed for chlorides, bromides and salts of the novel diazocondensates, which are, to a large extent, insoluble in water, such as the salts of aromatic sulfonic acids, tetrafluoroborates, and hexafluorophosphates. In these cases, solvents in which these compounds are only slightly soluble, e.g., ethers such as dioxane and tetrahydrofuran; esters such acetic acid ethylester, butyl acetate, and ethyleneglycol methylether acetate; ketones such as methyl ethyl ketone and cyclohexanone, and the like, are added to the alcohols or amides which, in general, are good solvents for these compounds, in order to improve the leveling properties of the coatings.

During processing, the copying material is exposed imagewise to actinic radiation through an original. Any light source conventionally used in the copying art which emits radiation in the long-wave ultraviolet range, such as carbon arc lamps, mercury high-pressure lamps, pulsed xenon lamps, and the like, may be employed for the imagewise exposure. Electron and laser irradiation may also be used for recording images.

After exposure, developing is carried out by means of a suitable developer. Water and aqueous solutions of surfactants, optionally containing an alkali admixture; aqueous salt solutions; aqueous acid solutions, e.g., solutions of phosphoric acids, which in turn, may contain salts; and aqueous-alkaline developers, e.g., aqueous solutions of sodium salts of phosphoric acid or salicylic acid, can be employed as developers. Organic solvents are not added to these developers.

An important feature of the present invention is that the light sensitive layer, which is composed of water insoluble components, can be developed with wholly aqueous developer compositions. That is, a developer which is a water mixture of salts and surfactants without the required addition of organic solvents.

In the practice of the present invention the water component is preferably present in the developer in an amount ranging from about 80% to about 95% based on the weight of the developer composition. A more preferred range is from about 80% to about 92%; and most preferably from about 85% to about 88%.

The salts of choice include one or more salts selected from the group consisting of sodium, potassium, and ammonium hydroxides, silicates, phosphates, bicarbonates, oxalates, carbonates, sulfates, chlorides, acetates, benzoates, borates, citrates, salicylates, and pyrophosphates.

In the practice of the present invention the salt component is preferably present in the developer in an amount ranging from about 7.7% to about 17% based on the weight of the developer. A more preferred range is from about 11.5% to about 13%.

Preferred anionic surfactants non-exclusively include sodium octyl sulfate, sodium decyl sulfate, ammonium lauryl sulfate, sodium tetradecyl sulfate and sodium lauryl sulfate.

In the practice of the present invention the surfactant component is preferably present in the developer in an amount ranging from about 0.3% to about 3.0% based on the weight of the developer. A more preferred range is from about 0.5% to about 2.0%; and most preferably from about 0.8% to about 1.2%.

Developing is carried out in the conventional manner, e.g., by dipping the plate into the developer liquid and/or wiping or spraying the developer liquid over the plate. In the process, the unexposed layer areas are removed.

The following examples illustrate the production of the novel diazo-polycondensates of the recording materials prepared therewith according to the present invention. In addition to the result of the elementary analysis, the atomic ratio calculated from these analysis values is given in a number of examples to characterize more precisely the diazo-condensates used. With certain reservations, this relative value allows conclusions concerning the ratio at which diazonium salt and co-components participate in the building up of the product. This ratio has been calculated on somewhat simplified assumptions, i.e., these data cannot be, nor are they intended to be, indications of the precise structure of the condensates according to the invention.

They are, however, sufficient for identifying condensation products, the properties of which are reproducible.

As mentioned above, the conditions of condensation, and particularly also the quantitative ratios used, are frequently of importance for a further characterization.

In the examples, parts by weight (p.b.w.) and parts by volume (p.b.v.) are related as are grams and milliliters. Unless otherwise stated, percentages are expressed in terms of weight, and temperatures are indicated in °C. In the analysis values, N denotes the total nitrogen content.

In the examples, the term "crude condensate" generally denotes the crude condensation mixture obtained in the condensation, which normally still contains the condensation medium.

EXAMPLE OF PREPARATION 1

29.2 p.b.w. of diphenylamine-4-diazonium sulfate are dissolved in 170 p.b.w. of a 90% strength methanesulfonic acid. 12.2 p.b.w. of 4-methyl-benzyl alcohol are metered into this mixture, which is then condensed for 2 hours at 40° C. 16.6 p.b.w. of 1,4-bis-methoxymethyl benzene are then added, followed by condensing for another 2 hours at 40° C. The crude condensate is dissolved in 5,000 p.b.v. of water and thereafter converted into its water-insoluble form by means of sodium mesitylenesulfonate. 35 p.b.w. of condensate are obtained.

(C: 71.5%, N: 6.5%; S: 5.2%; C : N : S = 38.5 : 3 : 1.05).

EXAMPLE OF PREPARATION 2

32.4 p.b.w. of 3-methoxy-diphenylamine-4-diazonium sulfate are dissolved in 170 p.b.w. of an 85% strength phosphoric acid. 22.8 p.b.w. of 4-methyl-4'-methoxymethyl-diphenyl-ether are added dropwise to this solution, which is then condensed for 2 hours at 40° C. Then 25.8 p.b.w. of 4,4'-bis-methoxy-methyl-diphenylether are added to the mixture, followed by condensing for another 27 hours at 40° C. The crude condensate is dissolved in 5,000 p.b.v. of water. Separation of the condensate is effected by adding 500 p.b.v. of a saturated sodium chloride solution. The chloride of the condensate is dissolved in 800 p.b.v. of a saturated sodium chloride solution. The chloride of the condensate is dissolved in 800 p.b.v. of water and from this solution the methanesulfonate is precipitated by the addition of 300 p.b.v. of a saturated sodium methanesulfonate solution. After filtering off by suction, the precipitate is dissolved in 800 p.b.v. of water and is again precipitated by the addition of 300 p.b.v. of a saturated sodium methanesulfonate solution. 59 p.b.w. of condensate are obtained.

(C: 65%; N: 5.0%; S: 5.8%; C : N : S = 45.5 : 3 : 1.52).

EXAMPLE OF PREPARATION 3

32.2 p.b.w. of 3-methoxy-diphenylamine-4-diazonium sulfate are dissolved in 170 p.b.w. of an 85% strength phosphoric acid, 22.8 p.b.w. of 4-methyl-4'-methoxymethyl-diphenylether are added dropwise to this solution, and the mixture is then condensed for 2 hours at 40° C. Then 25.8 p.b.w. of 4,4'-bis-methoxy-methyldiphenylether are added to the condensate, followed by condensing for 27 hours at 40° C. The crude condensate is dissolved in 5,000 p.b.v. of water and is converted into a water-insoluble form by means of sodium naphthalene-2-sulfonate. 76.5 p.b.w. of condensate are obtained, which displays excellent solubility in ethylene glycol monomethyl ether.

(C: 70.5%; N: 4.7%; S: 3.6%; $OCH_3$:4%; C : N : S : $OCH_3$ = 52.5 : 3 : 1 : 1.2).

EXAMPLE 4

A coating solution is prepared according to the following composition:
Phosphoric Acid (85%): 0.30g
Diazonium Salt * : 3.00g
Para-azodiphenyl Amine: 0.006g
Phthalocyanine Green Dispersed in Polyvinylformal Resin: 5.00g

*Diazonium salt: polycondensation product of 4 methyl-4'methoxy methyl diphenylether and 3-methoxy 4-diazo diphenylamine hydrogen sulfate then with 4,4'-bismethoxy methyl diphenylether, precipitated as mesitylene sulfonate.

The above ingredients are added sequentially in 12.6g of butyrolactone, 361.g of tetrahydrofuran and 64.7g of monopropylene-glycol monomethyl ether with vigorous stirring. The coating solution is then applied to an aluminum substrate which has been electrolytically roughened and pretreated with polyvinylphosphonic acid. The coating is dried with hot air. The exposed plate is satisfactorily developed with a developer having the following composition:
Water: 86.53
Sodium Benzoate: 1.32
Potassium Tetraborate $4H_2O$: 0.53
Sodium Octyl Sulfate: 1.06
Sodium Citrate $2H_2O$: 2.61
Sodium Salicylate: 7.95

EXAMPLE 5

Example 4 is repeated except usign phthalocyanine blue pigment dispersed in polyvinylformal resin instead of phthalo cyanine green. The results are comparable to Example 4.

EXAMPLE 6

Example 4 is repeated except using phthalocyanine blue pigment dispersed in polyvinyl butyral instead of dispersed in polyvinylformal resin. The results are comparable to Example 4.

EXAMPLE 7

Example 4 is repeated except using quinacridone pink pigment dispersed in polyvinylformal resin instead of green pigment. The results are comparable to Example 4.

EXAMPLE 8

Example 4 is repeated except the developers used are as in the following table. Similar satisfactory results are obtained.

| | 1 | 2 | 3 | 4 | 5 | 6 | 7 |
|---|---|---|---|---|---|---|---|
| Soft $H_2O$ | 90.8 | 85.5 | 87.5 | 88.29 | 86.5 | 88.0 | 91.0 |
| Sodium Octylsulfate | 3.0 | 3.0 | 3.0 | 2.0 | 3.0 | 3.0 | 3.0 |
| Monosodium Phosphate | 2.2 | | | | | | |
| Potassium Tetraborate | 3.0 | | | 1.21 | | | |
| Sodium Pyrophosphate | 1.0 | | 1.0 | | | | 3.0 |
| Dipotassium Phosphate | | 5.0 | 2.0 | | 5.0 | 3.0 | |
| Sodium Benzoate | | 6.0 | 6.0 | 2.5 | | 3.0 | |
| Monopotassium Phosphate | | 0.5 | 0.5 | | | | |

| -continued | | | | | | | |
|---|---|---|---|---|---|---|---|
| | 1 | 2 | 3 | 4 | 5 | 6 | 7 |
| Sodium Salicylate | | | | 6.0 | 4.0 | | |
| Citric Acid | | | | | 1.5 | | |
| Sodium Citrate | | | | | | 3.0 | |
| Sodium Bicarbonate | | | | | | | 3.0 |
| pH | 7.8 | 7.7 | 7.6 | 10.1 | 6.2 | 8.8 | 8.6 |

What is claimed is:

1. A method for producing and using a photographic element which comprises coating a substrate with a light sensitive composition, which composition comprises in admixture:
   (i) from about 1% by weight to about 21% by weight, based on the total weight of the non-solvent parts of said light sensitive composition, of a polyvinyl acetal resin; and
   (ii) from about 1.1% by weight to about 22% by weight, based on the total weight of the non-solvent parts of said light sensitive composition, of a colorant; and
   (iii) from about 63% by weight to about 92% by weight, based on the total weight of the non-solvent parts of said light sensitive composition, of a light-sensitive, water insoluble diazonium group-containing polycondensation product, which product is obtained first by condensation of
   (a) a diazonium salt corresponding to formula I

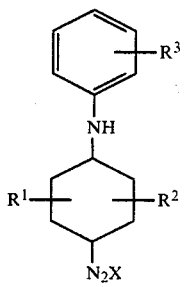

(I)

wherein
   $R^1$, $R^2$ and $R^3$ each denote separately a hydrogen atom, a halogen atom, an alkyl group having from 1 to 3 carbon atoms, or an alkoxy group having from 1 to 6 carbon atoms, and
   X denotes the anion of the diazonium salt;
   (b) with a compound corresponding to formula II $$R^4—O—CH_2—R^5 \quad (II)$$

wherein
   $R_4$ denotes a hydrogen atom, an alkyl group or an aliphatic acyl radical and
   $R^5$ denotes a mononuclear or polynuclear aromatic radical, which is unsubstituted or substituted by a halogen atom, an alkyl group, a halogenated alkyl group, an alkoxy group having from 1 to 3 carbon atoms, a carboxy group, an aryl group, an arylmercapto group, or an aryloxy group, in a strongly acidic medium, and thereafter condensing with
   (c) a compound corresponding to formula III $$R^6—O—CH_2—R^8—CH_2—O—R^7 \quad (III)$$

wherein $R^6$ and $R^7$ each denote separately a hydrogen atom, an alkyl group, or an aliphatic acyl radical, and
   $R^8$ denotes an aromatic hydrocarbon radical selected from the group consisting of a phenol, a phenolether, an aromatic thioether, an aromatic heterocyclic compound, and an organic acid amide,
   with the radicals resulting from compound II being directly linked to the units of the diazonium salt I; and thereafter imagewise exposing said coated substrate to actinic radiation and removing all or substantially all of the non-radiation-exposed areas with a non-organic solvent containing aqueous alkaline developer composition which consists essentially of in admixture:
   A. from about 80% by weight to about 95% by weight, based on the weight of said developer composition, water; and
   B. from about 7.7% by weight to about 17% by weight, based on the weight of said developer composition, of one or more salts selected from the group consisting of sodium, potassium, and ammonium hydroxides, silicates, phosphates, bicarbonates, oxalates, carbonates, sulfates, chlorides, acetates, benzoates, borates, citrates, salicylates, and pyrophosphates; and
   C. from about .3% by weight to about 3.0% by weight, based on the weight of said developer composition, of a anionic surfactant.

2. The method of claim 1 wherein said substrate comprises aluminum or an aluminum alloy.

3. The method of claim 1 wherein said colorant is a pigment.

4. The method of claim 1 wherein said surfactant comprises one or more compounds selected from the group consisting of sodium octyl sulfate, sodium decyl sulfate, ammonium lauryl sulfate, sodium tetradecyl sulfate, and sodium lauryl sulfate.

5. The method of claim 1 wherein said surfactant component comprises sodium octyl sulfate.

6. The method of claim 1 wherein said light sensitive composition further comprises one or more components selected from the group consisting of acids, exposure indicators, plasticizers and surfactants.

7. The method of claim 1 wherein said polyvinyl acetal component is present in an amount of from about 2% to about 15% by weight.

8. The method of claim 1 wherein said diazo component is present in an amount of from about 68% to about 57% by weight.

9. The method of claim 1 wherein said colorant is present in an amount of from about 2.2% to about 16.5% by weight.

10. The method of claim 1 wherein said salt is present in an amount of from about 11.5% to about 13% by weight.

11. The method of claim 1 wherein said surfactant is present in an amount of from about 0.5% to about 2.0% by weight.

12. The method of claim 1 wherein $R^4$, $R^6$ and $R^7$ each denote a hydrogen atom or an alkyl group having from 1 to 3 carbon atoms.

13. The method of claim 1 wherein $R^8$ comprises a radical having (a) one aromatic ring or (b) two aromatic rings which are linked by a single bond or by —O—, —NH—, —CH$_2$—, or —S—.

14. The method of claim 1 produced by condensing 1 mole of diazonium salt (I) with from about 0.1 to 1.5 moles of compound II and from about 0.5 to 1.5 moles of compound III.

15. The method of claim 1, wherein said diazonium salt comprises a diphenylamine-4-diazonium salt which is unsubstituted or is substituted by an alkyl or an alkoxy group having from 1 to 3 carbon atoms.

16. The method of claim 15, wherein said diazonium salt comprises a diazonium compound derived from 4-amino-diphenylamine, 3-methyl-4-aminodiphenylamine, or 3-methoxy-4-amino-diphenylamine.

* * * * *